(12) United States Patent
Lee et al.

(10) Patent No.: US 11,063,185 B2
(45) Date of Patent: Jul. 13, 2021

(54) LIGHT EMITTING DIODE WITH ZINC OXIDE LAYER AND METHOD OF FABRICATING THE SAME

(71) Applicant: SEOUL VIOSYS CO., LTD., Gyeonggi-do (KR)

(72) Inventors: Seom Geun Lee, Gyeonggi-do (KR); Chan Seob Shin, Gyeonggi-do (KR)

(73) Assignee: SEOUL VIOSYS CO., LTD., Gyeonggi-do (KR)

( * ) Notice: Subject to any disclaimer, the term of this patent is extended or adjusted under 35 U.S.C. 154(b) by 74 days.

(21) Appl. No.: 16/518,169

(22) Filed: Jul. 22, 2019

(65) Prior Publication Data
US 2020/0035865 A1    Jan. 30, 2020

(30) Foreign Application Priority Data
Jul. 24, 2018  (KR) .................. 10-2018-0085992

(51) Int. Cl.
*H01L 33/42*    (2010.01)
*H01L 33/38*    (2010.01)
(Continued)

(52) U.S. Cl.
CPC ............ *H01L 33/42* (2013.01); *H01L 33/007* (2013.01); *H01L 33/38* (2013.01); *H01L 33/32* (2013.01); *H01L 2924/12041* (2013.01)

(58) Field of Classification Search
None
See application file for complete search history.

(56) References Cited

U.S. PATENT DOCUMENTS

2016/0024688 A1* 1/2016 Richardson ............. C30B 29/16
                                                                 423/622
2016/0218244 A1* 7/2016 Shin ...................... H01L 33/42
(Continued)

FOREIGN PATENT DOCUMENTS

JP        2011-082479       4/2011
KR    10-2010-0047795       5/2010
(Continued)

OTHER PUBLICATIONS

International Search Report for International Application PCT/KR2019/008738, dated Oct. 30, 2019.

*Primary Examiner* — Benjamin P Sandvik
(74) *Attorney, Agent, or Firm* — Burris Law, PLLC

(57) ABSTRACT

A light emitting diode with a zinc oxide layer and a method of fabricating the same are disclosed. The light emitting diode includes: a light emitting structure including a gallium nitride based first conductivity type semiconductor layer, a gallium nitride based second conductivity type semiconductor layer, and an active layer interposed therebetween; and a ZnO transparent electrode layer disposed on the second conductivity type semiconductor layer, wherein the ZnO transparent electrode layer comprises a ZnO seed layer and a ZnO bulk layer formed on the ZnO seed layer, wherein the ZnO bulk layer is porous compared to the ZnO seed layer, wherein an interface between the ZnO seed layer and the second conductivity type semiconductor layer is flatter than an interface between the ZnO seed layer and the ZnO bulk layer, and wherein the interface between the ZnO seed layer and the ZnO bulk layer has an irregular concavo-convex shape.

12 Claims, 6 Drawing Sheets

(51) Int. Cl.
   *H01L 33/00*   (2010.01)
   *H01L 33/32*   (2010.01)

(56) References Cited

U.S. PATENT DOCUMENTS

2017/0069789 A1* 3/2017 Kim .................. H01L 33/38
2017/0077356 A1* 3/2017 Mughal ............. H01L 33/42
2017/0098741 A1* 4/2017 Lee .................. H01L 33/38

FOREIGN PATENT DOCUMENTS

| KR | 10-1256757 | 4/2013 |
| KR | 10-1296265 | 8/2013 |
| KR | 10-2017-0040112 | 4/2017 |

* cited by examiner

LIGHT EMITTING DIODE WITH ZINC OXIDE LAYER AND METHOD OF FABRICATING THE SAME

CROSS-REFERENCE TO RELATED APPLICATIONS

This application claims priority to and the benefit of Korean Patent Application No. 10-2018-0085992, filed on Jul. 24, 2018, which is hereby incorporated by reference for all purposes as if fully set forth herein.

TECHNICAL FIELD

Exemplary embodiments of the present disclosure relate to a light emitting diode with a zinc oxide layer and a method of fabricating the same, and more particularly, to a light emitting diode in which a zinc oxide layer is used as a transparent electrode.

BACKGROUND

III-nitride (III-N) based lasers or light emitting diodes have greatly changed the fields of lighting, display and data storage, and have continued to expand their applications.

In III-N based LED devices, typically low electrical conductivity of a p-type layer causes current crowding in the light emitting diode, which causes low luminous efficacy. To achieve high luminous efficacy, it is required to introduce a current spreading layer which is highly transparent to light generated in the light emitting diode. The current spreading layer forms a low resistive ohmic contact with a p-GaN layer, and has a low sheet resistance.

Indium-tin oxide (ITO) is a material currently selected by various LED manufacturers as an LED current spreading layer due to relatively high electrical conductivity and low optical absorption. However, there are considerable deviations in reported properties of ITO layers depending on various factors such as deposition method, deposition surface properties, annealing conditions, and compositional element ratios of indium and tin in the layer. In particular, if ITO may contain a large amount of defects in the layer, there is a limit to increasing a thickness thereof, and therefore, there is a limit to improving the current spreading performance using the high electrical conductivity.

To overcome these limitations of ITO, a technique of introducing an extension electrode extending from electrode pads while including a relatively thin ITO layer is used. In this case, however, the increase of a sheet resistance of ITO may cause a current to be crowded under the electrode pads and the extension electrode, and thus a current blocking layer has been added to a lower portion of the ITO layer near the electrode pads and the extension electrode. Adding the current blocking layer may complicate a fabrication process of the light emitting diode, and also reduce a contact area between the ITO layer and the p-GaN layer, thereby increasing a forward voltage of the light emitting diode.

Meanwhile, to solve problems of the ITO layer, a technique of using a ZnO layer as a transparent electrode has been studied. ZnO can be formed relatively thicker due to its low light absorption compared to ITO, and thus it is expected that the current can be evenly spread over a large area, thereby lowering the forward voltage. However, since the ZnO layer is formed by using source gases different from those for GaN, there is a problem in mass production since excessive process time is required as long as conventional CVD techniques are used.

SUMMARY

Exemplary embodiments of the present disclosure provide a light emitting diode including a ZnO transparent electrode, and having high productivity and reliability, and a method of fabricating the same.

Exemplary embodiments of the present disclosure provide a light emitting diode capable of operating under a high current and a high voltage, and capable of uniformly spreading current to a plurality of light emitting cells.

In accordance with one aspect of the present disclosure, a light emitting diode comprises: a light emitting structure including a gallium nitride based first conductivity type semiconductor layer, a gallium nitride based second conductivity type semiconductor layer, and an active layer interposed therebetween; and a ZnO transparent electrode layer disposed on the second conductivity type semiconductor layer, wherein the ZnO transparent electrode layer comprises a ZnO seed layer and a ZnO bulk layer formed on the ZnO seed layer, wherein the ZnO bulk layer is porous compared to the ZnO seed layer, wherein an interface between the ZnO seed layer and the second conductivity type semiconductor layer is flatter than an interface between the ZnO seed layer and the ZnO bulk layer, and wherein the interface between the ZnO seed layer and the ZnO bulk layer has an irregular concavo-convex shape.

In accordance with another aspect of the present disclosure, a light emitting diode comprising: a light emitting structure including a gallium nitride based first conductivity type semiconductor layer, a gallium nitride based second conductivity type semiconductor layer, and an active layer interposed therebetween; and a ZnO transparent electrode layer disposed on the second conductivity type semiconductor layer, wherein the ZnO transparent electrode layer comprises a ZnO seed layer and a ZnO bulk layer formed on the ZnO seed layer, wherein the ZnO seed layer is formed on the gallium nitride based second conductivity type semiconductor layer by a sol-gel method, and the ZnO bulk layer is grown on the ZnO seed layer through hydrothermal synthesis, and wherein the ZnO bulk layer is porous compared to the ZnO seed layer.

In accordance with another aspect of the present disclosure, a method of manufacturing a light emitting diode comprises: growing a first conductivity type semiconductor layer, an active layer and a second conductivity type semiconductor layer on a substrate wherein the first conductivity type semiconductor layer and the second conductivity type semiconductor layer are gallium nitride-based semiconductor layers, forming a ZnO seed layer on the gallium nitride based second conductivity type semiconductor layer by a sol-gel method, and growing a ZnO bulk layer through hydrothermal synthesis on the ZnO seed layer.

In accordance with aspects of the present disclosure, it is possible to provide a light emitting diode having improved current spreading performance in a structure wherein a ZnO transparent electrode layer is included. In particular, a ZnO seed layer is formed using the sol-gel method, and a ZnO bulk layer is grown thereon through hydrothermal synthesis method, whereby a ZnO transparent electrode layer is formed at a low temperature and at a low cost, and thus it is suitable for mass production of light emitting diodes. Further, by including the ZnO seed layer formed by using the sol-gel method, the forward voltage of the light emitting diode may be lowered, and thus it is possible to improve the reliability of the light emitting diodes.

The foregoing general description and the following detailed description are exemplary and explanatory, and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF EMBODIMENTS

Figure 1:
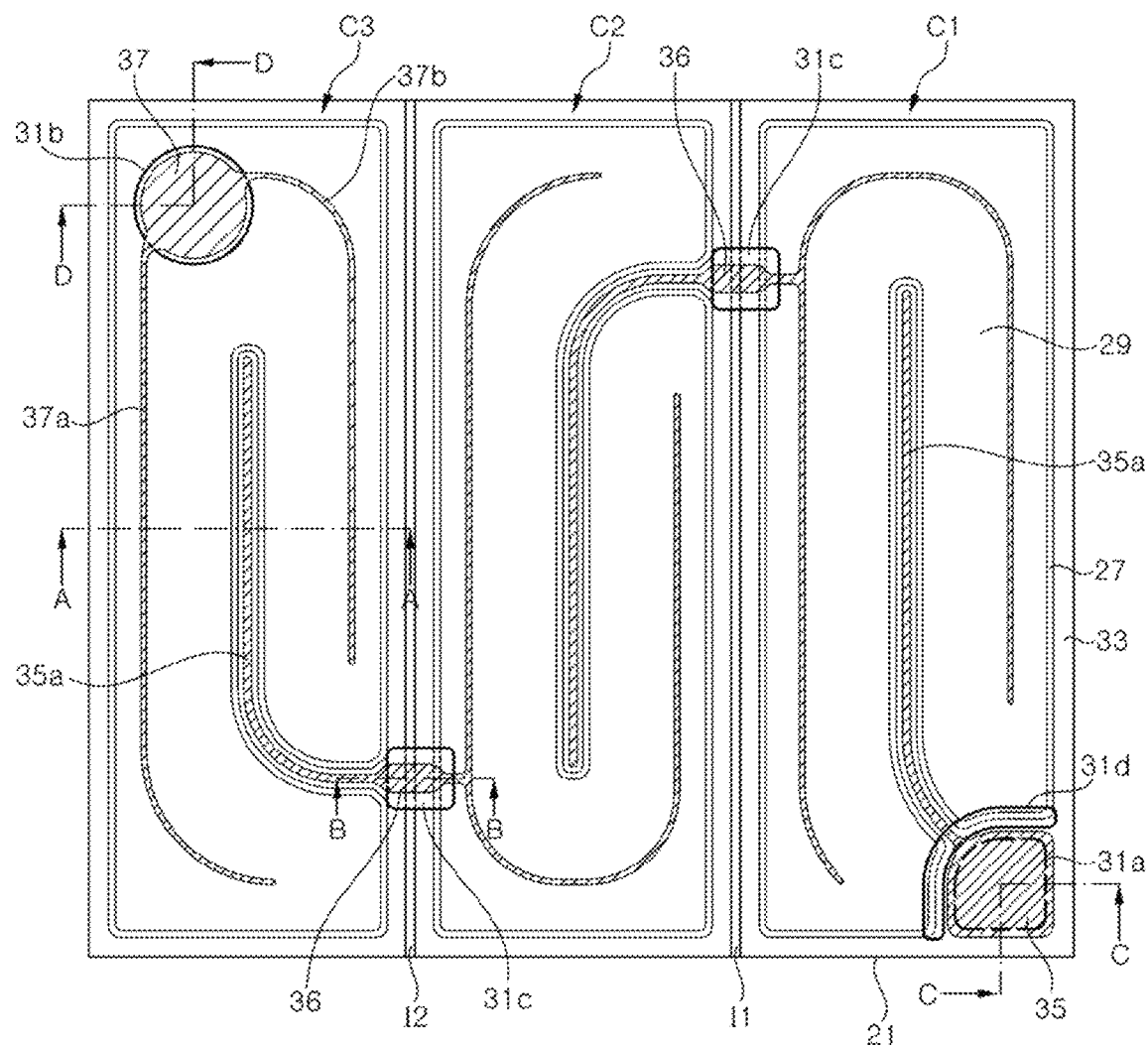
FIG. 1 is a plan view illustrating a light emitting diode according to an exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In accordance with one aspect of the present disclosure, a light emitting diode comprises: a light emitting structure including a gallium nitride based first conductivity type semiconductor layer, a gallium nitride based second conductivity type semiconductor layer, and an active layer interposed therebetween; and a ZnO transparent electrode layer disposed on the second conductivity type semiconductor layer, wherein the ZnO transparent electrode layer comprises a ZnO seed layer and a ZnO bulk layer formed on the ZnO seed layer, wherein the ZnO bulk layer is porous compared to the ZnO seed layer, wherein an interface between the ZnO seed layer and the second conductivity type semiconductor layer is flatter than an interface between the ZnO seed layer and the ZnO bulk layer, and wherein the interface between the ZnO seed layer and the ZnO bulk layer has an irregular concavo-convex shape.

In a structure wherein no or fewer voids on the interface between the ZnO seed layer and the second conductivity type semiconductor layer are formed, it is possible to reduce a contact resistance between the transparent electrode layer and the second conductivity type semiconductor layer, thereby lowering a forward voltage. In addition, by suppressing an occurrence of voids on the interfaces of the transparent electrode layer and the second conductivity type semiconductor layer, it is possible to prevent an increase in the forward voltage over use, thereby improving the reliability of the light emitting diode.

Meanwhile, the ZnO bulk layer may include relatively larger voids in a region adjacent to the ZnO seed layer than an upper surface thereof. As growth of ZnO bulk layer progresses, a crystallinity of the ZnO bulk layer may be improved, and thus the voids become smaller or rarer toward the upper surface.

The ZnO seed layer may be formed on the gallium nitride based second conductivity type semiconductor layer by a sol-gel method, and the ZnO bulk layer may be grown on the ZnO seed layer through hydrothermal synthesis. By using the sol-gel method and the hydrothermal synthesis method, a large amount of the transparent electrode layer may be formed at a relatively low temperature and at a low cost.

In particular, in a structure wherein a ZnO seed layer is formed by using the sol-gel method, it is possible to improve the interface characteristics between the ZnO seed layer and the second conductivity type semiconductor layer.

Meanwhile, the transparent electrode layer may have a thickness within a range of 1000 Å to 1 μm. Within this thickness range, the transparent electrode layer may have good light transmittance and current spreading performance, and thus it is possible to provide a light emitting diode capable of being driven under a high current.

The light emitting diode may further include a substrate, and the light emitting structure may be disposed on the substrate. Moreover, the light emitting structure may include a plurality of light emitting cells spaced apart from one another, and the ZnO transparent electrode layer may be disposed on each of the second conductivity type semiconductor layers of the light emitting cells.

In one embodiment, the plurality of light emitting cells may be disposed in parallel with one another.

Moreover, the light emitting diode comprises a first electrode pad electrically connected to a first conductivity type semiconductor layer of at least one light emitting cell; and a second electrode pad electrically connected to the second conductivity type semiconductor layer of the at least one light emitting cell, wherein the light emitting cells may be connected in series between the first electrode pad and the second electrode pad.

In a structure where the light emitting cells are connected in series, it is possible to provide a light emitting diode capable of being driven under a high voltage.

Meanwhile, the light emitting diode may further comprise a first electrode extension disposed on the first conductivity type semiconductor layer of each light emitting cell; and a second electrode extension disposed on the transparent electrode layer of each light emitting cell. In a structure where the electrode extensions are included, it is possible to further improve current spreading performance.

Moreover, the light emitting diode may further comprise connectors electrically connecting adjacent light emitting cells to one another.

Meanwhile, the second conductivity type semiconductor layer of each light emitting cell may be surrounded by an upper surface of the first conductivity type semiconductor layer exposed by mesa etching. Accordingly, when an isolation region is formed to separate the light emitting cells from one another, the second conductivity type semiconductor layer and the transparent electrode may be prevented from being damaged.

The transparent electrode layer may be disposed in an upper region of the second conductivity type semiconductor layer. A lower surface of the transparent electrode layer may have a smaller area than that of an upper surface of the second conductivity type semiconductor layer. The transparent electrode layer and the mesa may be patterned using the same photoresist pattern. In this case, the ZnO transparent electrode layer may be patterned by wet etching, and the second conductivity type semiconductor layer and the active layer may be patterned by dry etching. Since the ZnO transparent electrode layer is also etched in the horizontal direction by wet etching, it is formed to have a smaller area than that of the second conductivity type semiconductor layer.

In accordance with another aspect of the present disclosure, a light emitting diode comprising: a light emitting structure including a gallium nitride based first conductivity type semiconductor layer, a gallium nitride based second conductivity type semiconductor layer, and an active layer interposed therebetween; and a ZnO transparent electrode layer disposed on the second conductivity type semiconductor layer, wherein the ZnO transparent electrode layer comprises a ZnO seed layer and a ZnO bulk layer formed on the ZnO seed layer, wherein the ZnO seed layer is formed on the gallium nitride based second conductivity type semiconductor layer by a sol-gel method, and the ZnO bulk layer is grown on the ZnO seed layer through hydrothermal synthesis, and wherein the ZnO bulk layer is porous compared to the ZnO seed layer.

The ZnO bulk layer may include relatively larger voids in a region adjacent to the ZnO seed layer than an upper surface thereof.

The light emitting diode may further include a substrate, and the light emitting structure may be disposed on the substrate.

The light emitting structure may include a plurality of light emitting cells spaced apart from one another, and the ZnO transparent electrode layer may be disposed on each of the second conductivity type semiconductor layers of the light emitting cells.

Furthermore, the second conductivity type semiconductor layer of each light emitting cell may be surrounded by an upper surface of the first conductivity type semiconductor layer exposed by mesa etching.

In accordance with another aspect of the present disclosure, a method of manufacturing a light emitting diode comprises: growing a first conductivity type semiconductor layer, an active layer and a second conductivity type semiconductor layer on a substrate wherein the first conductivity type semiconductor layer and the second conductivity type semiconductor layer are gallium nitride-based semiconductor layers, forming a ZnO seed layer on the gallium nitride based second conductivity type semiconductor layer by a sol-gel method, and growing a ZnO bulk layer through hydrothermal synthesis on the ZnO seed layer.

The ZnO bulk layer may be porous compared to the ZnO seed layer.

Meanwhile, an interface between the ZnO seed layer and the second conductivity type semiconductor layer may be flatter than an interface between the ZnO seed layer and the ZnO bulk layer.

Figure 2A:
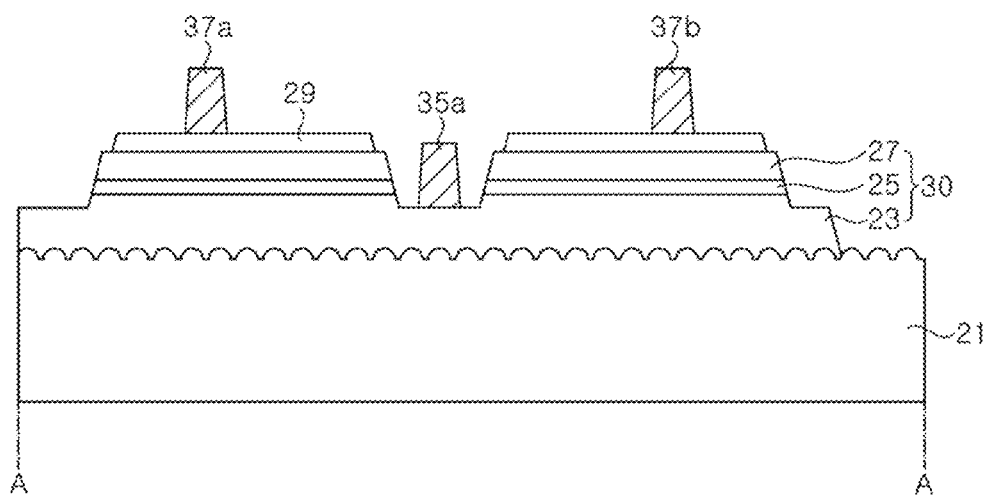
FIG. 2A is a cross-sectional view taken along the line A-A in FIG. 1.
Figure 2B:
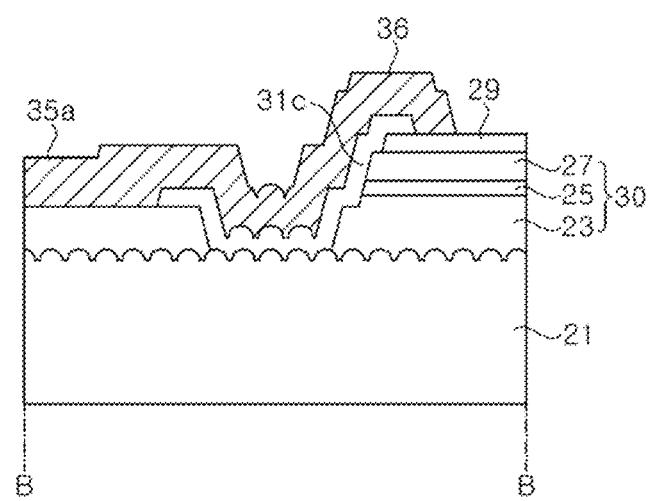
FIG. 2B is a cross-sectional view taken along the line B-B in FIG. 1.
Figure 2C:
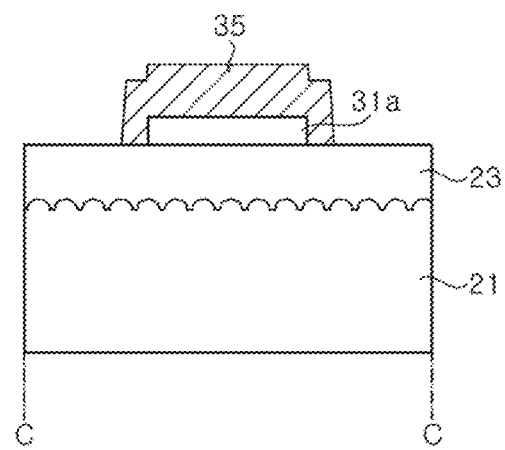
FIG. 2C is a cross-sectional view taken along the line C-C in FIG. 1.
Figure 2D:
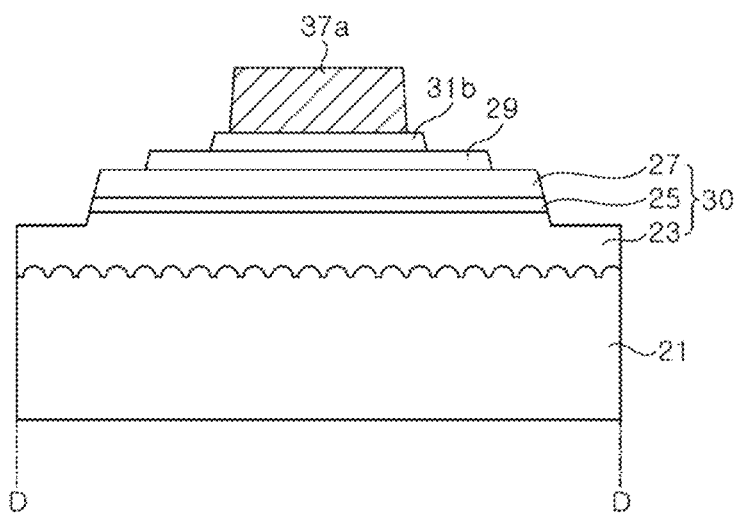
FIG. 2D is a cross-sectional view taken along the line D-D in FIG. 1.
Figure 3:
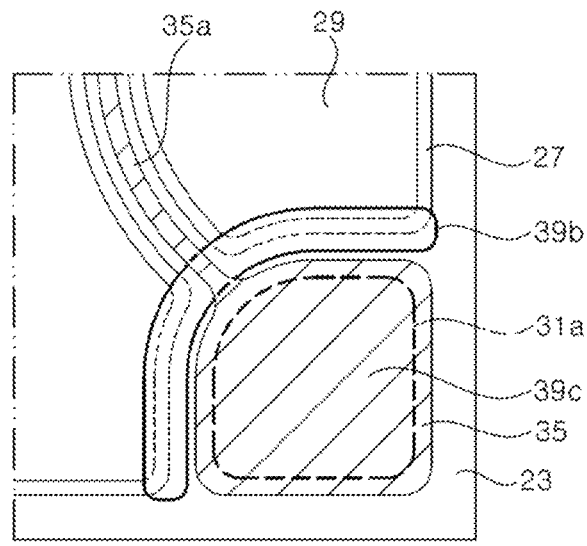
FIG. 3 is an enlarged plan view of a first electrode pad of FIG. 1.

FIG. 1 is a plan view illustrating a light emitting diode according to an exemplary embodiment of the present disclosure, FIGS. 2A, 2B, 2C and 2D are schematic cross-sectional views taken along the lines A-A, B-B, C-C and D-D, respectively, and FIG. 3 is an enlarged plan view of a first electrode pad 35 of FIG. 1.

Referring to FIGS. 1, 2A, 2B, 2C, and 2D, the light emitting diode includes a substrate 21, a light emitting structure 30, a transparent electrode 29, insulation layers 31a, 31b, 31c, and 31d, a first electrode pad 35, a second electrode pad 37, first extensions 35a, second extensions 37a and third extensions 37b. Herein, the light emitting structure 30 is divided into a plurality of light emitting cells C1, C2, and C3, and the first to third extensions 35a, 37a, and 37b are disposed on each of the light emitting cells.

As the substrate 21, any substrate capable of growing a gallium nitride based semiconductor layer may be used without limitation. Examples of the substrate 21 include a sapphire substrate, a gallium nitride substrate, a SiC substrate, or others, and may be a patterned sapphire substrate. The substrate 21 may have a rectangular or square shape as shown in the plan view of FIG. 1, but it is not limited thereto. A size of the substrate 21 is not particularly limited and may be variously selected.

The light emitting structure 30 is disposed on the substrate 21, and includes a first conductivity type semiconductor layer 23, an active layer 25, and a second conductivity type semiconductor layer 27. The first conductivity type semiconductor layer 23 may be an n-type semiconductor layer, and the second conductivity type semiconductor layer 27 may be a p-type semiconductor layer, or vice versa. The active layer 25 is interposed between the first conductivity type semiconductor layer 23 and the second conductivity type semiconductor layer 27.

The first conductivity type semiconductor layer 23, the active layer 25 and the second conductivity type semiconductor layer 27 may be formed of a gallium nitride compound semiconductor material, i.e. (Al, In, Ga)N. Compositional elements and a compositional ratio of the active layer 25 may be determined to emit light having a desired wavelength, and the first conductivity type semiconductor layer 23 and the second conductivity type semiconductor layer 27 may be formed of materials having a larger band gap than the active layer 25.

The first conductivity type semiconductor layer 23 and the second conductivity type semiconductor layer 27 may be formed of a single layer or may be formed of multiple layers, respectively. In addition, the active layer 25 may have a single quantum well structure or a multiple quantum well structure. Further, although not shown in the drawing, a buffer layer may be interposed between the substrate 21 and the first conductivity type semiconductor layer 23.

The light emitting structure 30 may be formed by using Metal Organic Chemical Vapor Deposition ("MOCVD") or Molecular Beam Epitaxy ("MBE") technology, and a partial region of the first conductivity type semiconductor layer 23 may be exposed by etching the second conductivity type semiconductor layer 27 and the active layer 25 using photolithography and etching processes.

The light emitting structure 30 is divided into a plurality (n) of light emitting cells by cell isolation regions I1 and I2. Although FIG. 1 shows three light emitting cells C1, C2, and C3, it is not limited thereto. The n may be an integer of 2 or more, and particularly, may be an integer of 3 or more. Furthermore, when then is an odd number, the electrode pads 35 and 37 may be disposed in the diagonal direction of the substrate 21, which is advantageous.

The light emitting cells C1, C2, and C3 may have an elongated rectangular shape, and may be disposed in parallel with one another. Accordingly, even-numbered light emitting cells are disposed between the odd-numbered light emitting cells. For example, as shown in FIG. 1, the second light emitting cell C2 is disposed between the first and third light emitting cells C1 and C3.

Both side walls of the cell isolation regions I1 and I2 as shown in FIG. 1 are formed using the photolithography and etching processes, and have relatively gentle inclinations in consideration of the reliability of connectors 36.

However, side surfaces of the substrate 21 (see the left side surface of the substrate 21 in FIG. 2A) may be formed using laser scribing, and accordingly, have relatively steep inclinations unlike the cell isolation regions I1 and I2. In particular, the substrate 21 and the first conductivity type semiconductor layer 23 may be separated from other light emitting diodes using laser scribing at the same time, and thus the side surfaces of the substrate 21 and the first conductivity type semiconductor layer 23 may be in flush with each other.

Meanwhile, referring back to FIG. 1, an upper surface of the first conductivity type semiconductor layer 23 is exposed along edges of the light emitting cells C1, C2, and C3. That is, the second conductivity type semiconductor layer 27 is surrounded by the upper surface of the exposed first conductivity type semiconductor layer 23. The upper surface of the first conductivity type semiconductor layer 23 may be exposed along an entire periphery of the second conductivity type semiconductor layer 27.

A transparent electrode layer 29 is disposed on the second conductivity type semiconductor layer 27 of each of the light emitting cells C1, C2, and C3. The transparent electrode layer 29 is formed of ZnO, and is in contact with the second conductivity type semiconductor layer 27. That is, the transparent electrode layer 29 electrically contacts the second conductivity type semiconductor layer 27, and has a lower resistivity than the second conductivity type semiconductor layer 27, thereby spreading the current over a wide region of the light emitting diode.

The ZnO transparent electrode layer 29 has substantially the same shape in plan view as the second conductivity type semiconductor layer 27. However, the ZnO transparent electrode layer 29 may have a smaller area than that of the second conductivity type semiconductor layer 27. All of a lower surface of the ZnO transparent electrode layer 29 may be in contact with the upper surface of the second conductivity type semiconductor layer 27.

The ZnO transparent electrode layer 29 may contain any materials as long as Zn and O constitute a majority of a compound and retain a Wurtzite crystal structure of ZnO. For example, the ZnO transparent electrode layer 29 includes aluminum-doped zinc oxide (AZO), gallium-doped zinc oxide (GZO), and indium-doped zinc oxide (IZO). The ZnO transparent electrode 29 also includes materials that are non-stoichiometric due to the presence of vacancy and interstitial material defects as well as materials that contain small amounts of other dopants and/or other impurities or content materials.

The ZnO transparent electrode layer 29 may have a thickness of about 5 times or more of a thickness of a general ITO layer. For example, the general ITO layer is usually formed to have a thickness of about 500 Å or less due to the absorption, but since the ZnO transparent electrode layer 29 has a low absorption, it may be formed to have a thickness of 1000 Å or more, further 5000 Å or more. A maximum limit of the ZnO transparent electrode layer 29 is not particularly limited, but it may be about 1 μm or less.

Since the ZnO transparent electrode layer 29 may be formed thick, a sheet resistance may be reduced, thereby more easily spreading the current. A specific structure and a fabrication method of ZnO will be described in detail below with reference to FIG. 4.

As shown in FIG. 1, the first electrode pad 35 may be disposed on the first light emitting cell C1, and the second electrode pad 37 may be disposed on the third light emitting cell. The first electrode pad 35 may be disposed on the exposed upper surface of the first conductivity type semiconductor layer 23. However, the present disclosure is not limited thereto, the first electrode pad 35 may be disposed on the second conductivity type semiconductor layer 27 with an insulation layer interposed therebetween. In addition, the first electrode pad 35 may be disposed near one corner of the first light emitting cell C1.

A first extension 35a is electrically connected to the first conductivity type semiconductor layer 23 exposed through a mesa etching process. The first extension 35a on the first light emitting cell C1 may extend from the first electrode pad 35, and the first extensions 35a on the other light emitting cells C1 and C2 may extend from a connector 36.

The second electrode pad 37 is disposed on the transparent electrode layer 29. The second electrode pad 37 may be disposed near the other corner of the substrate 21 opposite to the first electrode pad 35, thereby facilitating a process of bonding wires.

As shown in FIG. 1, the second extension 37a and the third extension 37b on each of the light emitting cells C1, C2, and C3 may be disposed on the transparent electrode layer 29 to surround the first extension 35a. In this embodiment, since the second electrode pad 37 is not disposed on all of the light emitting cells C1 to C3, not all of the second extensions 37a and the third extensions 37b extend from the second electrode pad 37. As shown in FIG. 1, the second extension 37a and the third extension 37b on the third light emitting cell C3 extend from the second electrode pad 37, but the second extension 37a and the third extension 37b on the first and second light emitting cells C1 and C2 are spaced apart from the second electrode pad 37, and extend from the connector 36 electrically connecting the light emitting cells.

The second extensions 37a and the third extensions 37b are disposed on the transparent electrode layer 29 on each of the light emitting cells C1 to C3 and are electrically connected to the transparent electrode layer 29, respectively.

Meanwhile, the connectors 36 electrically connect adjacent light emitting cells. Specifically, the connectors 36 connect the first extension 35a of one light emitting cell and the second and third extensions 37a and 37b of the adjacent light emitting cell. As shown in FIG. 2B, one end of the connector 36 may be disposed on the first conductivity type semiconductor layer 23 and connected to the first extension 35a, and the other end of the connector 36 may be disposed on the second conductivity type semiconductor layer 27. As seen in FIG. 1, the other end of the connector 36 disposed on the second conductivity type semiconductor layer 27 is connected to the second and third extensions 37a and 37b.

Two connectors 36 are disposed near corners of the light emitting cells (for example, C2) in the diagonal direction except for the first light emitting cell C1 and the third light emitting cell C3 (last light emitting cell). The connector 36 connected to the first light emitting cell C1 is disposed near one corner in the diagonal direction opposite to the first electrode pad 35, and the connector 36 connected to the third light emitting cell C3 is disposed near one corner in the diagonal direction opposite to the second electrode pad 37. The first, second and third extensions 35a, 37a and 37b on the first light emitting cell C1 and the first, second and third extensions on the second light emitting cell C2 have substantially similar shapes. Since the first to third extensions 35a, 37a, and 37b on the adjacent light emitting cells are arranged in an inverted shape with respect to one another, it is possible to design the second extension 37a and the third extension 37b to have substantially the same or similar lengths, and to form the first extension 35a relatively longer as a single line. Therefore, it is possible to achieve a substantially uniform current spread on both sides of the first extension 35a.

In the present embodiment, the first electrode pad 35, the second electrode pad 37, the first extensions 35a, the connectors 36, the second extensions 37a and the third extensions 37b may be formed of same materials in the same process at the same time. However, the present disclosure is not limited thereto, they may be formed of different materials in different processes.

Meanwhile, a first insulation layer 31a may be disposed under the first electrode pad 35. The first insulation layer 31a reduces direct current flow from the first electrode pad 35 to the first conductivity type semiconductor layer 23 and contributes to current spread. As shown in FIG. 2C, the first insulation layer 31a may be disposed under a partial region of the first electrode pad 35, and accordingly, an edge region of the first electrode pad 35 may be connected to the first conductivity type semiconductor layer 23. In a structure wherein an area of the first insulation layer 31a and an area of the first electrode pad 35 are adjusted, it is possible to adjust an area where the first electrode pad 35 contacts the first conductivity type semiconductor layer 23, thereby controlling the forward voltage.

A second insulation layer 31b may be disposed under the second electrode pad 37 to separate the second electrode pad 37 from the transparent electrode layer 29. For example, the second insulation layer 31b may be formed in a disk shape, as shown in FIG. 1, and may have a larger area than that of the second electrode pad 37. The second electrode pad 37 may be disposed on the insulation layer 31b and spaced apart from the transparent electrode layer 29. However, the present disclosure is not limited thereto, the second insulation layer 31b may be formed to have an opening, and the second electrode pad 37 may partially contact the transparent electrode layer 29. In a structure wherein the second electrode pad 37 is disposed on the second insulation layer 31b, it is possible to reduce the current crowding under the second electrode pad 37.

Meanwhile, an insulation layer 39c (FIG. 3) may be interposed under the connector 36 to prevent the first conductivity type semiconductor layer 23 and the second conductivity type semiconductor layer 27 on one light emitting cell from being short-circuited by the connector 36.

Moreover, a fourth insulation layer 31d (FIG. 1) may cover side walls of the active layer 25 and the second conductivity type semiconductor layer 27 exposed around the first electrode pad 35 as shown in the enlarged plan view of FIG. 3. The fourth insulation layer 31d prevents a bonding wire from being short-circuited to the second conductivity type semiconductor layer 27 or the active layer 25 in a case that the first electrode pad 35 is bonded the wire. In this embodiment, the fourth insulation layer 31d may be formed in a continuous curved shape, and the first extension 35a may pass an upper portion of the fourth insulation layer 31d. However, the present disclosure is not limited thereto, a portion of the fourth insulation layer 31d may be omitted.

In some embodiments, the first to fourth insulation layers 31a, 31b, 31c, and 31d may be formed of same materials in the same process at the same time. The present disclosure is not limited and different materials, different processes, and/or different times may be used in forming the first to fourth insulation layers 31a, 31b, 31c, and 31d. In particular, these insulation layers 31a, 31b, 31c, and 31d may be formed using a lift-off process and may be formed as a distributed Bragg reflector.

Figure 4:
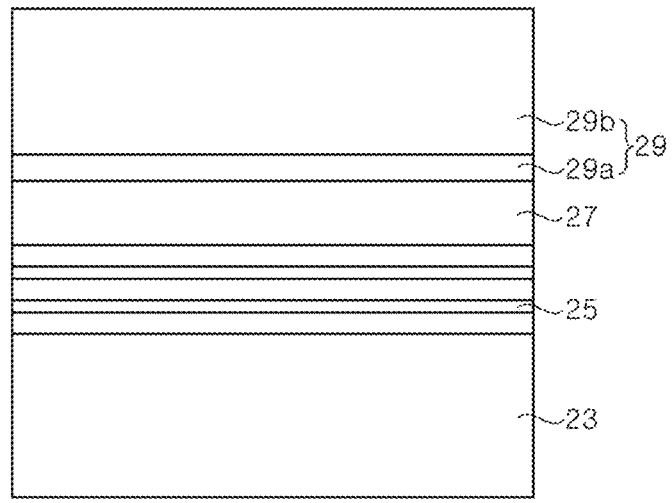
FIG. 4 is a partial cross-sectional view illustrating a transparent electrode layer of a light emitting diode according to an exemplary embodiment of the present disclosure.

FIG. 4 is a partial cross-sectional view illustrating a transparent electrode layer 29 of the light emitting diode according to one exemplary embodiment of the present disclosure.

Referring to FIG. 4, the ZnO transparent electrode layer 29 is disposed on the second conductivity type semiconductor layer 27 and includes a ZnO seed layer 29a and a ZnO bulk layer 29b. By way of example only, the ZnO seed layer 29a may have a thickness within a range of about 5 nm to 20 nm. In this embodiment, the ZnO seed layer 29a is formed as a continuous layer, and is distinct from the ZnO bulk layer 29b. The ZnO bulk layer 29b is a porous layer containing a plurality of voids while the ZnO seed layer 29a is a layer having a higher density than the ZnO bulk layer 29b.

In this embodiment, the ZnO seed layer 29a is formed by the sol-gel method. Since the sol-gel method is used, the ZnO seed layer 29a may be formed as a continuous high-density layer on the second conductivity type semiconductor layer 27. In particular, since the second conductivity type semiconductor layer 27 is a gallium nitride based semiconductor layer having a Wurtzite crystal structure, the ZnO seed layer 29a of the Wurtzite crystal structure may be easily formed on the second conductivity type semiconductor layer 27. On the other hand, the ZnO bulk layer 29b may be formed through hydrothermal synthesis, and thus the ZnO bulk layer 29b may be formed at a relatively low temperature and at a low cost.

Generally, a method of forming the ZnO seed layer by spin-coating a solution in which ZnO powder is dissolved in ammonia has been studied so as to form the ZnO layer. However, it is difficult to form a high-density ZnO seed layer on the semiconductor layer by the method using the ammonia solution. Such a porous ZnO seed layer does not completely cover the semiconductor layer but exposes an upper surface of the semiconductor layer. In a case that the ZnO bulk layer is formed on the porous ZnO seed layer through the hydrothermal synthesis method, it is difficult to distinguish the ZnO seed layer from the bulk layer, and a large number of voids are also formed on the interface between the semiconductor layer and the ZnO layer. The voids between the ZnO layer and the semiconductor layer will increase the resistance and the voids will grow as the time of use increases, thereby increasing the forward voltage.

On the contrary, the ZnO seed layer 29a using the sol-gel method is formed as a relatively high-density layer as compared with the ammonia-based ZnO seed layer, and thus an entire surface of the second conductivity type semiconductor layer 27 may be covered. Therefore, even if the ZnO bulk layer 29b is formed on the ZnO seed layer 29a through the hydrothermal synthesis method, the ZnO seed layer 29a which is distinguishable from the ZnO bulk layer 29b remains, and it is possible to prevent voids from being formed between the ZnO seed layer 29a and the second conductivity type semiconductor layer 27. Accordingly, a contact resistance between the ZnO transparent electrode layer 29 and the second conductivity type semiconductor layer 27 may be lowered, and thus the forward voltage may be lowered. In addition, it is possible to prevent voids from being formed on the interface between the ZnO transparent electrode layer 29 and the second conductivity type semiconductor layer 27, thereby solving the problem that the forward voltage increases over the time of use.

The ZnO seed layer 29a may be formed by the sol-gel method by combining a precursor such as zinc acetated dehydrate with an alcohol such as ethanol and a solvent to form a sol, which is spin coated and heat treated on the substrate 27. Since the sol is formed first and then spin-coated, a high-density ZnO seed layer may be formed. To form the sol using the sol-gel method, the solution may be maintained at a temperature in a range of about 50° C. to 60° C. for 20 minutes to 1 hour, and the heat treatment after spin coating may be performed at a temperature in a range of 300° C. to 700° C.

Formation of ZnO seed layers 29a using the sol-gel method is suitable for mass production of the light emitting diode having the ZnO transparent electrode layer 29 since formation of ZnO seed layers 29a using the sol-gel method is faster and cheaper than formation of seed layers using CVD or ALD.

Meanwhile, the ZnO bulk layer 29b may be grown by immersing the substrate 21 on which the ZnO seed layer 29a is formed in the ammonia solution in a supercritical state. The ZnO bulk layer 29b may be grown on the ZnO seed layer 29a, and a plurality of voids may be formed on the ZnO bulk layer 29b. However, the ZnO bulk layer 29b has fewer voids than the ZnO bulk layer grown on the ZnO seed layer of the ammonia substrate, and has a relatively higher density.

Figure 5A:
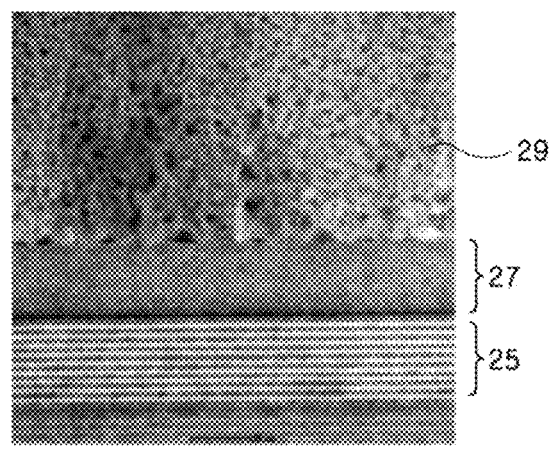
FIG. 5A is a scanning electron micrograph illustrating a ZnO transparent electrode layer according to a comparative example.
Figure 5B:
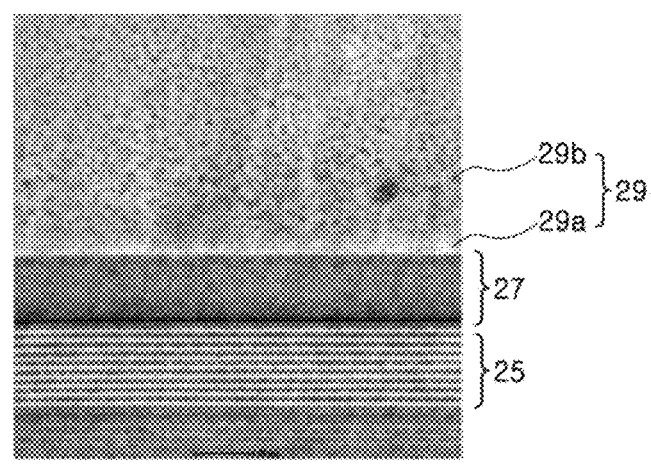
FIG. 5B is a scanning electron micrograph of a ZnO transparent electrode layer according to an embodiment of the present disclosure.

FIGS. 5A and 5B are scanning electron micrographs illustrating the ZnO seed layer based on the ammonia solution and the ZnO transparent electrode layer 29 formed by using the ZnO seed layer using the sol-gel method, respectively. Herein, the ZnO bulk layers 29b were grown through hydrothermal synthesis under the same conditions.

Referring to FIG. 5A, it is difficult to distinguish the seed layer from the bulk layer in the transparent electrode layer 29 grown on the second conductivity type semiconductor layer 27, and it can be seen that a large number of voids are formed on the interface between the transparent electrode layer 29 and the second conductivity type semiconductor layer 27.

On the contrary, referring to FIG. 5B, the ZnO seed layer 29a formed by the sol-gel method is distinguished from the porous ZnO bulk layer 29b, and no void is observed on the interface between the ZnO seed layer 29a and the second conductivity type semiconductor layer 27. In addition, no void is observed even in the ZnO seed layer 29a of FIG. 5B, and it can be seen that the density thereof is higher than that of the ZnO bulk layer 29b.

Furthermore, it can be seen that the voids in the ZnO bulk layer 29b in the embodiment of FIG. 5B are also relatively smaller in size than those in the bulk layer of FIG. 5A, and the ZnO bulk layer 29b of FIG. 5B is more dense than the bulk layer of FIG. 5A.

In addition, referring to FIG. 5B, it can be seen that the interface between the ZnO seed layer 29a and the second conductivity type semiconductor layer 27 is flatter than that between the ZnO seed layer 29a and the ZnO bulk layer 29b. It is thought that an upper surface of the ZnO seed layer 29a is deformed in shape while the ZnO bulk layer 29b is being grown, but a lower surface is maintained in shape without being deformed. In particular, it can be seen that the interface between the ZnO seed layer 29a and the ZnO bulk layer 29b has an irregular concavo-convex shape.

The ZnO bulk layer 29b is porous and includes the plurality of voids in different sizes therein. In particular, it can be seen that the ZnO bulk layer 29 includes relatively larger voids in a region adjacent to the ZnO seed layer 29b than an upper surface thereof.

Figure 6:
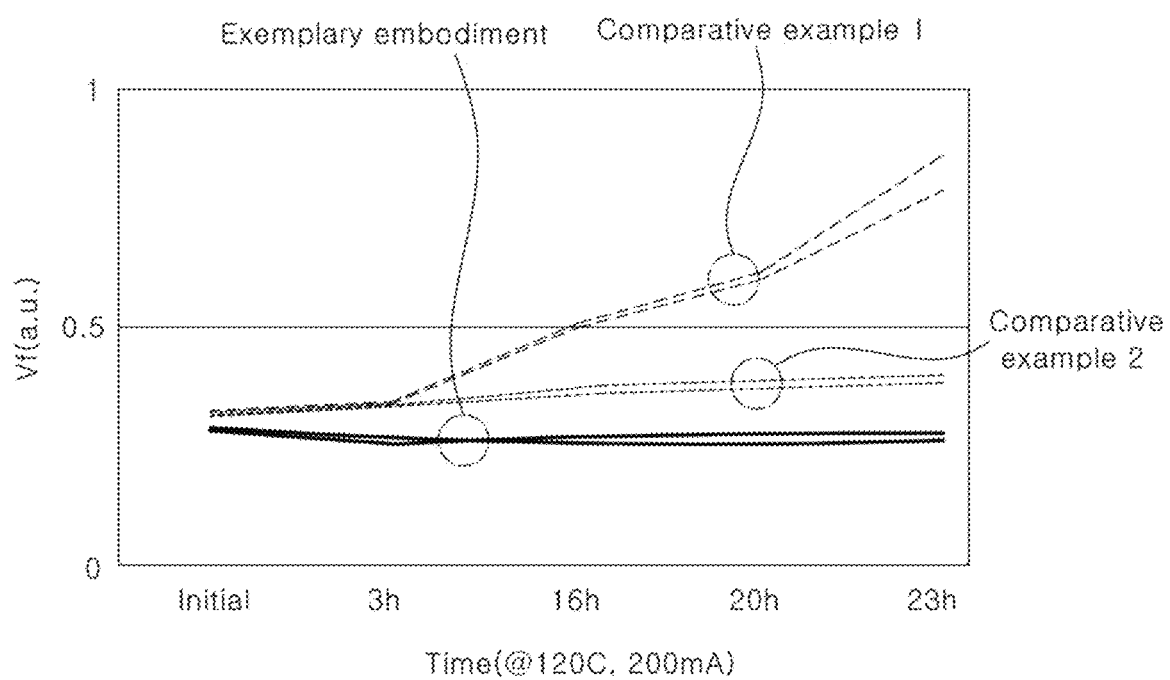
FIG. 6 is a graph illustrating a change in the forward voltage over the time of use of light emitting diodes according to comparative examples and an exemplary embodiment.

FIG. 6 is a graph illustrating a change in the forward voltage over the time of use of light emitting diodes according to comparative examples and this exemplary embodiment. The forward voltage was measured over time by applying a current of 200 mA at a temperature of 120° C. under accelerating conditions.

Comparative Example 1 shows the forward voltage of the light emitting diode in which a ZnO transparent electrode layer was formed using a ZnO seed layer based on the ammonia solution, Comparative Example 2 shows the forward voltage of the light emitting diode using a conventional ITO transparent electrode layer, and the exemplary embodiment shows the forward voltage of the light emitting diode in which the ZnO transparent electrode layer is formed using the ZnO seed layer formed by the sol-gel method.

The forward voltage of the light emitting diode of Comparative Example 1 using the ZnO seed layer based on the ammonia solution is similar to that of the light emitting diode of Comparative Example 2 to which ITO is applied. Meanwhile, the light emitting diode of Comparative Example 2 based on ITO showed a tendency that the forward voltage thereof slightly increases over time.

On the other hand, the light emitting diode of the present embodiment showed a lower initial forward voltage than those of the light emitting diodes of Comparative Examples 1 and 2, and the forward voltage thereof tended to decrease somewhat over time. Therefore, in a structure where the ZnO seed layer is formed using the sol-gel method and the ZnO transparent electrode layer 29b is formed using the ZnO seed layer, it is possible to lower the forward voltage, and it is expected that the light emitting diode with high reliability may be provided.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

We claim:
1. A light emitting diode comprising:
   a light emitting structure including a gallium nitride based first conductivity type semiconductor layer, a gallium nitride based second conductivity type semiconductor layer, and an active layer interposed therebetween; and
   a ZnO transparent electrode layer disposed on the second conductivity type semiconductor layer,
   wherein the ZnO transparent electrode layer comprises a ZnO seed layer and a ZnO bulk layer formed on the ZnO seed layer, the ZnO bulk layer comprising a porous layer, wherein an interface between the ZnO seed layer and the second conductivity type semiconductor layer is flatter than an interface between the ZnO seed layer and the ZnO bulk layer, and wherein the interface between the ZnO seed layer and the ZnO bulk layer has an irregular concavo-convex shape.

2. The light emitting diode of claim 1, wherein the ZnO bulk layer includes relatively larger voids in a region adjacent to the ZnO seed layer than an upper surface thereof.

3. The light emitting diode of claim 1, wherein the ZnO seed layer is formed on the gallium nitride based second conductivity type semiconductor layer by a sol-gel method, and the ZnO bulk layer is grown on the ZnO seed layer through hydrothermal synthesis.

4. The light emitting diode of claim 1, wherein the transparent electrode layer has a thickness within a range of 1000 Å to 1 μm.

5. The light emitting diode of claim 1, further comprising:
a substrate, wherein the light emitting structure is disposed on the substrate.

6. The light emitting diode of claim 5, wherein the light emitting structure includes a plurality of light emitting cells spaced apart from one another, and wherein the ZnO transparent electrode layer is disposed on each of the second conductivity type semiconductor layers of the light emitting cells.

7. The light emitting diode of claim 6, wherein the plurality of light emitting cells are disposed in parallel with one another.

8. The light emitting diode of claim 6, comprising:

a first electrode pad electrically connected to a first conductivity type semiconductor layer of at least one light emitting cell; and a second electrode pad electrically connected to the second conductivity type semiconductor layer of the at least one light emitting cell, wherein the light emitting cells are connected in series between the first electrode pad and the second electrode pad.

9. The light emitting diode of claim 8, further comprising:

a first electrode extension disposed on the first conductivity type semiconductor layer of each light emitting cell; and a second electrode extension disposed on the transparent electrode layer of each light emitting cell.

10. The light emitting diode of claim 9, further comprising:

connectors electrically connecting adjacent light emitting cells to one another.

11. The light emitting diode of claim 6, wherein the second conductivity type semiconductor layer of each light emitting cell is surrounded by an upper surface of the first conductivity type semiconductor layer exposed by mesa etching.

12. The light emitting diode of claim 11, wherein the transparent electrode layer is disposed in an upper region of the second conductivity type semiconductor layer, and wherein a lower surface of the transparent electrode layer has a smaller area than that of an upper surface of the second conductivity type semiconductor layer.

* * * * *